US011025223B2

(12) United States Patent
Jian

(10) Patent No.: US 11,025,223 B2
(45) Date of Patent: Jun. 1, 2021

(54) MINIATURE TUNABLE FILTERS

(71) Applicant: Telefonaktiebolaget LM Ericsson (publ), Stockholm (SE)

(72) Inventor: Chunyun Jian, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 301 days.

(21) Appl. No.: 15/781,833

(22) PCT Filed: Jan. 15, 2016

(86) PCT No.: PCT/IB2016/050209
§ 371 (c)(1),
(2) Date: Jun. 6, 2018

(87) PCT Pub. No.: WO2017/122052
PCT Pub. Date: Jul. 20, 2017

(65) Prior Publication Data
US 2018/0367118 A1 Dec. 20, 2018

(51) Int. Cl.
*H03H 9/54* (2006.01)
*H03H 9/60* (2006.01)
(Continued)

(52) U.S. Cl.
CPC .......... *H03H 9/542* (2013.01); *H03H 9/0004* (2013.01); *H03H 9/52* (2013.01);
(Continued)

(58) Field of Classification Search
CPC ........ H03H 9/0004; H03H 9/52; H03H 9/542; H03H 9/545; H03H 9/547; H03H 9/605;
(Continued)

(56) References Cited

U.S. PATENT DOCUMENTS

| 5,122,878 A | 6/1992 | Heigl et al. |
| 6,535,722 B1 | 3/2003 | Rosen et al. |

(Continued)

FOREIGN PATENT DOCUMENTS

| RU | 2 117 385 01 | * 8/1998 |
| WO | 2012/079038 A1 | 6/2012 |
| WO | 2015/119177 A1 | 8/2015 |

OTHER PUBLICATIONS

Ken-ya Hashimoto, et al.—Title: "Tunable RF SAWBAW Filters: Dream or Reality?" Conference Held in San Francisco, CA (USA), Published in: 2011 Joint Conference of the IEEE International Frequency and Time Forum (FCS), pp. 1-8, May 2-5, 2011, consisting of 8 pages.

(Continued)

*Primary Examiner* — Barbara Summons
(74) *Attorney, Agent, or Firm* — Sage Patent Group

(57) ABSTRACT

A tunable filter using acoustic resonators is disclosed. A tunable filter includes a plurality of tunable resonator units (20). Each tunable resonator unit (20) has acoustic wave resonators (12). Each acoustic wave resonator is associated with a different tunable frequency. Each tunable resonator unit also has a first switch (22) configured to select one of the plurality of acoustic wave resonators of the tunable resonator unit at a time. The first switches of the plurality of tunable resonator units are coupled to cooperatively select one acoustic wave resonator in each one of the plurality of tunable resonator units, where a selected acoustic wave resonator in a tunable resonator unit of the plurality of tunable acoustic resonator units is associated with a same tunable frequency response as the other selected acoustic resonators of the others of the plurality of tunable acoustic resonator units. The selection results in an overall tunable frequency response.

15 Claims, 13 Drawing Sheets

(51) Int. Cl.
*H03H 9/56* (2006.01)
*H03H 9/64* (2006.01)
*H03H 9/00* (2006.01)
*H03H 9/52* (2006.01)

(52) U.S. Cl.
CPC ............ *H03H 9/568* (2013.01); *H03H 9/605* (2013.01); *H03H 9/6409* (2013.01); *H03H 9/6483* (2013.01); *H03H 2210/012* (2013.01); *H03H 2210/025* (2013.01); *H03H 2210/033* (2013.01)

(58) Field of Classification Search
CPC .. H03H 9/6403; H03H 9/6406; H03H 9/6409; H03H 9/6423; H03H 9/6483; H03H 2009/02204; H03H 2210/012; H03H 2210/025; H03H 2210/033
USPC ................................. 333/189, 193, 195, 133
See application file for complete search history.

(56) References Cited

U.S. PATENT DOCUMENTS

| 7,084,722 | B2 | 8/2006 | Goyette |
| 7,095,454 | B2 | 8/2006 | Waight et al. |
| 7,676,243 | B2 | 3/2010 | Leinonen et al. |
| 9,660,611 | B2* | 5/2017 | Burgener ............... H03H 9/542 |
| 2004/0130411 | A1* | 7/2004 | Beaudin ............. H03H 9/14547 |
| | | | 333/133 |
| 2009/0201104 | A1 | 8/2009 | Ueda et al. |
| 2013/0142089 | A1 | 6/2013 | Azarnaminy et al. |
| 2016/0164481 | A1* | 6/2016 | Madan .................. H03H 7/175 |
| | | | 333/174 |
| 2016/0352310 | A1* | 12/2016 | Tani ........................ H03H 9/64 |
| 2016/0359469 | A1* | 12/2016 | Ella .......................... H03H 7/38 |
| 2017/0288632 | A1* | 10/2017 | Mori ........................ H03H 7/12 |
| 2018/0234078 | A1* | 8/2018 | Wada .................. H03H 9/6406 |

OTHER PUBLICATIONS

Robert Aigner, Title: "Tunable Filters Reality Check!" Published in: IEEE Magazine, vol. 16:(7):82-88, Jul. 8, 2015, consisting of 7-pages.

Tomoya Komatsu et al., Title: "Tuneable Radio-Frequency Filters Using Acoustic Wave Resonators and Variable Capacitors", Japanese Journal of Applied Physics, Published Jul. 20, 2010, consisting of 4-pages.

International Search Report and Written Opinion of the International Searching Authority dated Dec. 13, 2016, issued in corresponding PCT Application Serial No. PCT/IB2016/050209, consisting of 26-pages.

Invitation to Pay Additional Fees and, Where Applicable, Protest Fee dated Sep. 30, 2016 issued in corresponding PCT Application Serial No. PCT/IB2016/050209, consisting of 7 pages.

* cited by examiner

MINIATURE TUNABLE FILTERS

CROSS-REFERENCE TO RELATED APPLICATIONS

This application is a Submission Under 35 U.S.C. § 371 for U.S. National Stage Patent Application of International Application Number: PCT/IB2016/050209, filed Jan. 15, 2016 entitled "MINIATURE TUNABLE FILTERS" the entirety of which is incorporated herein by reference.

TECHNICAL FIELD

Wireless communication and in particular, miniature tunable band pass and band reject filters for wireless transceivers.

BACKGROUND

Tunable filters are used in the transceivers of wireless communications devices such as in base stations and portable wireless devices, for example cell phones, tablets, portable computing devices, etc. In contrast to filter banks or switchable filters, which have fixed pass bands or fixed reject bands, tunable filters exhibit a tunable continuous frequency response over a frequency band. From a practicality standpoint, a tunable filter should be small in size and light in weight. Traditional microwave tunable filters are too large, bulky and expensive for most commercial wireless communication applications.

In contrast to microwave tunable filters, acoustic wave resonators, such as surface acoustic wave (SAW) resonators, bulk acoustic wave (BAW) resonators and film bulk acoustic resonators (FBAR), are small in size, light in weight and relatively inexpensive. Therefore, these acoustic wave resonators are used in fixed band filters found in mobile handsets and other small wireless devices.

FIG. 1 is a graph of a desired frequency response of a tunable band pass filter showing exemplary tuning bands. FIG. 2 is a graph of a desired frequency response of a tunable band reject filter showing exemplary tuning bands. FIG. 3 is a circuit diagram of a narrowly tunable band pass filter with acoustic wave resonators 12 in tunable resonator units 14 having tunable capacitors 16. FIG. 4 is a graph of a tunable frequency response of the narrowly tunable band pass filter of FIG. 3. The tunable capacitors of FIG. 3 may be adjusted to vary the pass band of the band pass filter, as shown in FIG. 4. Three examples of the tunable frequency response are shown in FIG. 4: a lowest response, an intermediate response and a highest response. Although the arrangement of FIG. 3 provides the ability to adjust the pass band of the filter, the tunable range of the design of FIG. 3 is inherently limited by an electromechanical coupling coefficient of the material used in the acoustic resonator. The largest electromechanical coupling coefficient of commercially available acoustic resonators is about 6%.

Note that the maximum range of tuning of the circuit of FIG. 3 is only about 20 Megahertz (MHz), which is unsuitable for the wide band operating frequency bands of current and planned future wireless communication systems. Because the operating bandwidth of wireless communication systems has substantially increased and will continue to increase, there is a demand for miniature tunable filters that can be tuned over a very broad frequency range.

SUMMARY

Some embodiments advantageously provide a tunable filter using acoustic resonators. According to one aspect, a tunable filter includes a plurality of tunable resonator units. Each tunable resonator unit has a plurality of acoustic wave resonators. Each acoustic wave resonator of the plurality of acoustic wave resonators is associated with a different tunable frequency response. Each different tunable frequency response has a corresponding bandwidth. Each tunable resonator unit also has a first switch configured to select one of the plurality of acoustic wave resonators of the tunable resonator unit at a time. The first switches of the plurality of tunable resonator units are coupled to cooperatively select one acoustic wave resonator in each one of the plurality of tunable resonator units, where a selected acoustic wave resonator in a tunable resonator unit of the plurality of tunable acoustic resonator units is associated with a same tunable frequency response as the other selected acoustic resonators of the others of the plurality of tunable acoustic resonator units. The selection results in an overall tunable frequency response.

According to this aspect, in some embodiments, each different tunable frequency response is a band pass filter response and the overall tunable frequency response is a band pass frequency response. In some embodiments, each different tunable frequency response is a band reject filter response and the overall tunable frequency response is a band reject frequency response. In some embodiments, at least two of the plurality of tunable resonator units are electrically in series. In some embodiments, at least two of the plurality of tunable resonator units are electrically in parallel. In some embodiments, the tunable filter also includes a tunable matching block electrically in parallel with at least one of the plurality of tunable resonator units and the tunable filter is a band reject filter.

In some embodiments, each of the plurality of acoustic wave resonators has a corresponding input and output. In such embodiments, the first switch being electrically coupled to one of the inputs and the outputs of the plurality of acoustic wave resonators. In some embodiments, each tunable resonator unit further comprises a second switch configured to cooperate with the first switch to select one of the plurality of acoustic wave resonators at a time. In some embodiments, each of the plurality of acoustic wave resonators has a corresponding input and a corresponding output and: the first switch is electrically coupled to one of the inputs and the outputs of the plurality of acoustic wave resonators and the second switch is electrically coupled to the other of the inputs and the outputs of the plurality of acoustic wave resonators.

According to another aspect, some embodiments include a tunable band pass filter. The tunable band pass filter has a plurality of tunable resonator units. Each tunable resonator unit has a plurality of acoustic wave resonators. Each acoustic resonator is associated with a different tunable band pass frequency response, each tunable band pass frequency response having a bandwidth. Each tunable resonator unit also has a first switch configured to select one of the plurality of acoustic wave resonators at a time. The first switches of the plurality of tunable resonator units are coupled to cooperatively select one acoustic wave resonator in each one of the plurality of tunable resonator units. Each selected acoustic wave resonator in a tunable resonator unit of the plurality of tunable resonator units is associated with a same tunable band pass frequency response as the other selected acoustic resonators of the others of the plurality of tunable acoustic resonator units. This selectability achieves an overall tunable band pass frequency response.

According to this aspect, in some embodiments, at least two of the plurality of tunable resonator units are electrically in series. In some embodiments, at least two of the plurality of tunable resonator units are electrically in parallel. In some embodiments, each tunable resonator unit further comprises a second switch configured to cooperate with the first switch to select one of the plurality of acoustic wave resonators at a time. In some embodiments, the number of acoustic wave resonators in each tunable resonator unit is N, and the number of different tunable band pass frequency responses is N. In some embodiments, a tuning range of each of the N different tunable bandpass frequency responses partially overlap adjacent ones of the N tunable band pass frequency responses.

In some embodiments, each of the plurality of acoustic wave resonators has a corresponding input and output, the first switch being electrically coupled to one of the inputs and the outputs of the plurality of acoustic wave resonators. In some embodiments, each of the plurality of acoustic wave resonators has a corresponding input and a corresponding output, the first switch being electrically coupled to one of the inputs and the outputs of the plurality of acoustic wave resonators and a second switch being electrically coupled to the other of the inputs and the outputs of the plurality of acoustic wave resonators.

According to yet another aspect, a tunable band reject filter is provided. The tunable band reject filter includes a plurality of tunable resonator units. Each tunable resonator unit includes a plurality of acoustic wave resonators. Each acoustic wave resonator is associated with a different tunable band reject frequency response, each tunable band reject frequency response having a bandwidth. Each tunable resonator unit also includes a first switch configured to select one of the plurality of acoustic wave resonators at a time. The first switches of the plurality of tunable resonator units are coupled to cooperatively select one acoustic wave resonator in each one of the plurality of tunable resonator units. A selected acoustic wave resonator in a tunable acoustic resonator unit of the plurality of tunable acoustic resonator units is associated with a same tunable band reject frequency response as the other selected acoustic resonators of the others of the plurality of tunable acoustic resonator units. The selectivity achieves an overall tunable band reject frequency response.

According to this aspect, three tunable resonator units are in an electrical T configuration. In some embodiments, the tunable band reject filter also includes a tunable matching block in parallel with one of the three tunable resonator units. In some embodiments, three tunable resonator units are in an electrical pi configuration. In some embodiments, the tunable band reject filter also includes two tunable matching blocks, each tunable matching block electrically in parallel with one of the three tunable resonator units. In some embodiments, each tunable resonator unit further includes a second switch configured to cooperate with the first switch to select one of the plurality of acoustic wave resonators at a time. In some embodiments, the number of acoustic wave resonators in each tunable resonator unit is N, and the number of different tunable band reject filter responses is N.

In some embodiments, each of the plurality of acoustic wave resonators has a corresponding input and output and the first switch is electrically coupled to one of the inputs and the outputs of the plurality of acoustic wave resonators. In some embodiments, each of the plurality of acoustic wave resonators has a corresponding input and a corresponding output. In these embodiments, the first switch is electrically coupled to one of the inputs and the outputs of the plurality of acoustic wave resonators and a second switch is electrically coupled to the other of the inputs and the outputs of the plurality of acoustic wave resonators.

According to another embodiment, a tunable band reject filter is provided having only one acoustic wave resonator per tunable resonator unit. In this embodiment, three tunable resonator units are electrically connected in one of a pi and a T configuration, each tunable resonator unit having an acoustic wave resonator, the acoustic wave resonator being associated with a tunable band reject frequency response. The band reject filter also includes a tunable matching block electrically in parallel with at least one of the three tunable resonator units.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figures 1, 2:
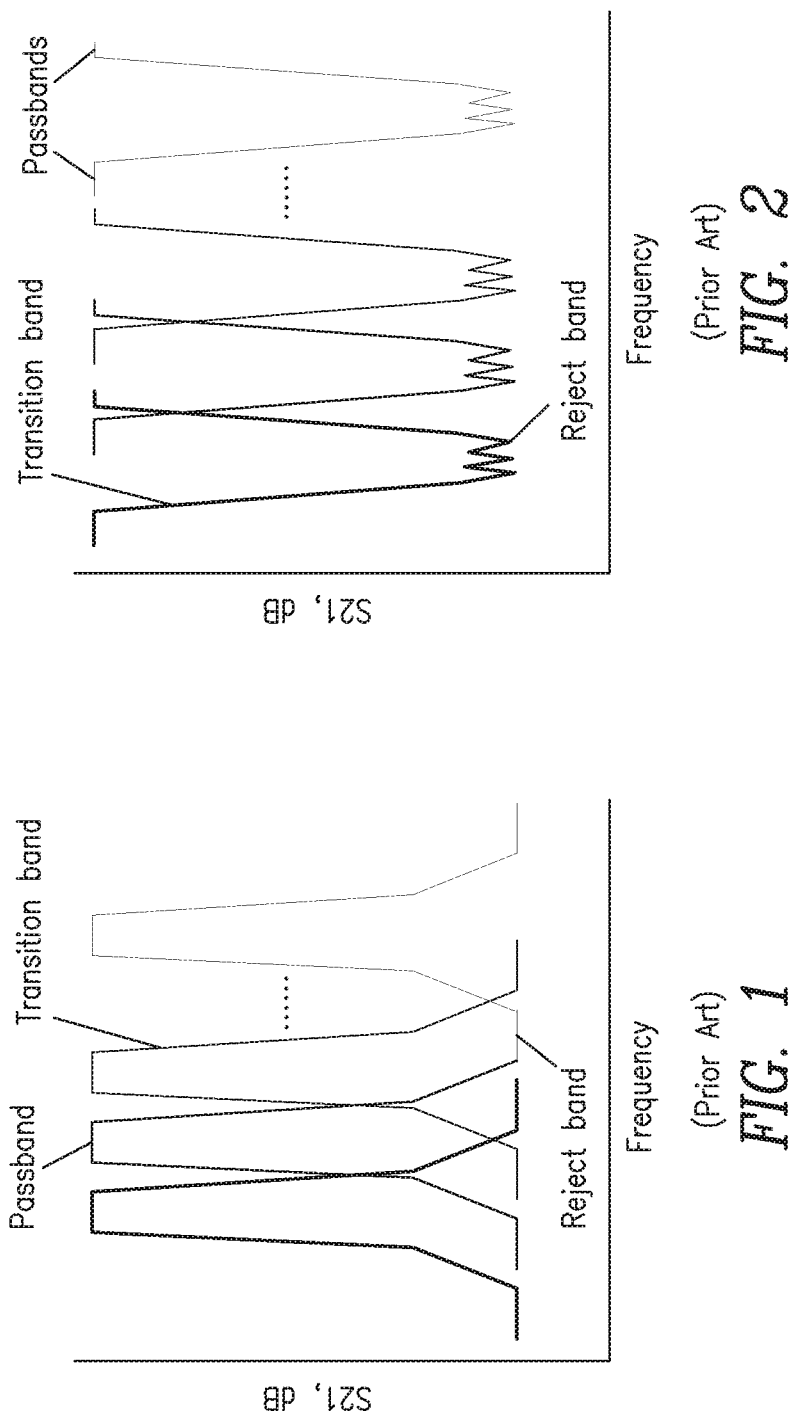
FIG. 1 is a graph of a series of band pass filter responses.
FIG. 2 is a graph of a series of band reject filter responses.
Figure 3:
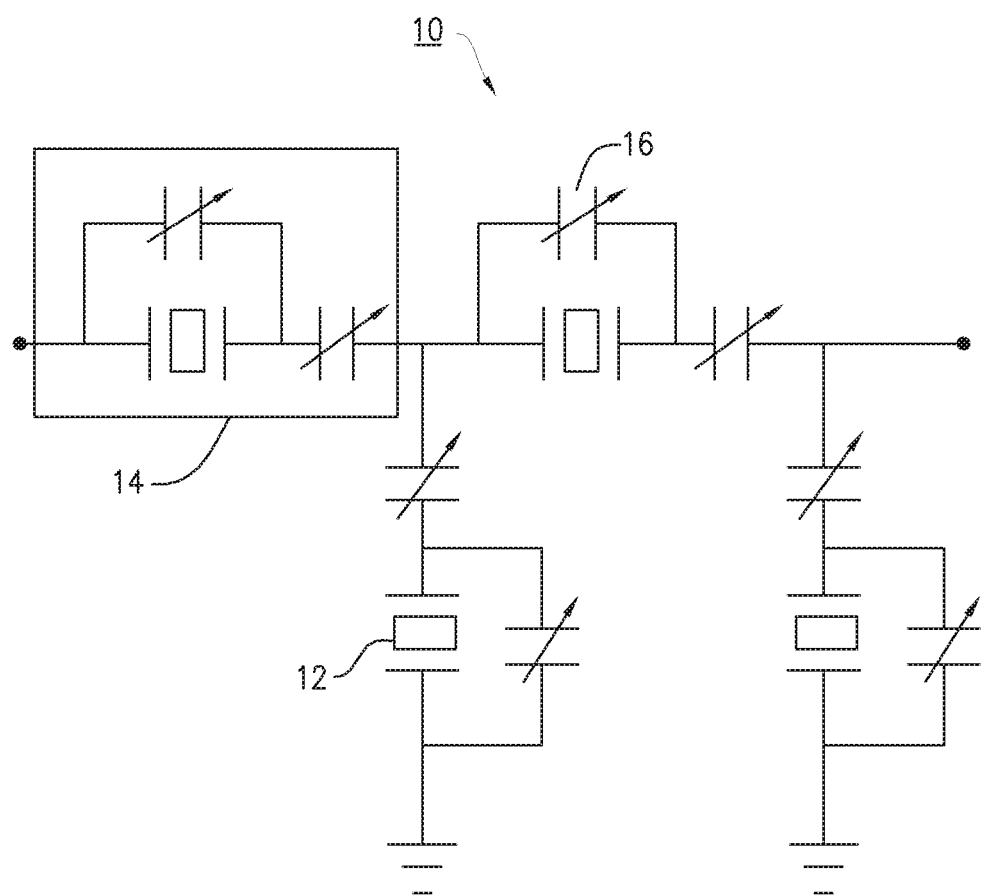
FIG. 3 is a known tunable band pass filter configuration using acoustic resonators.
Figure 4:
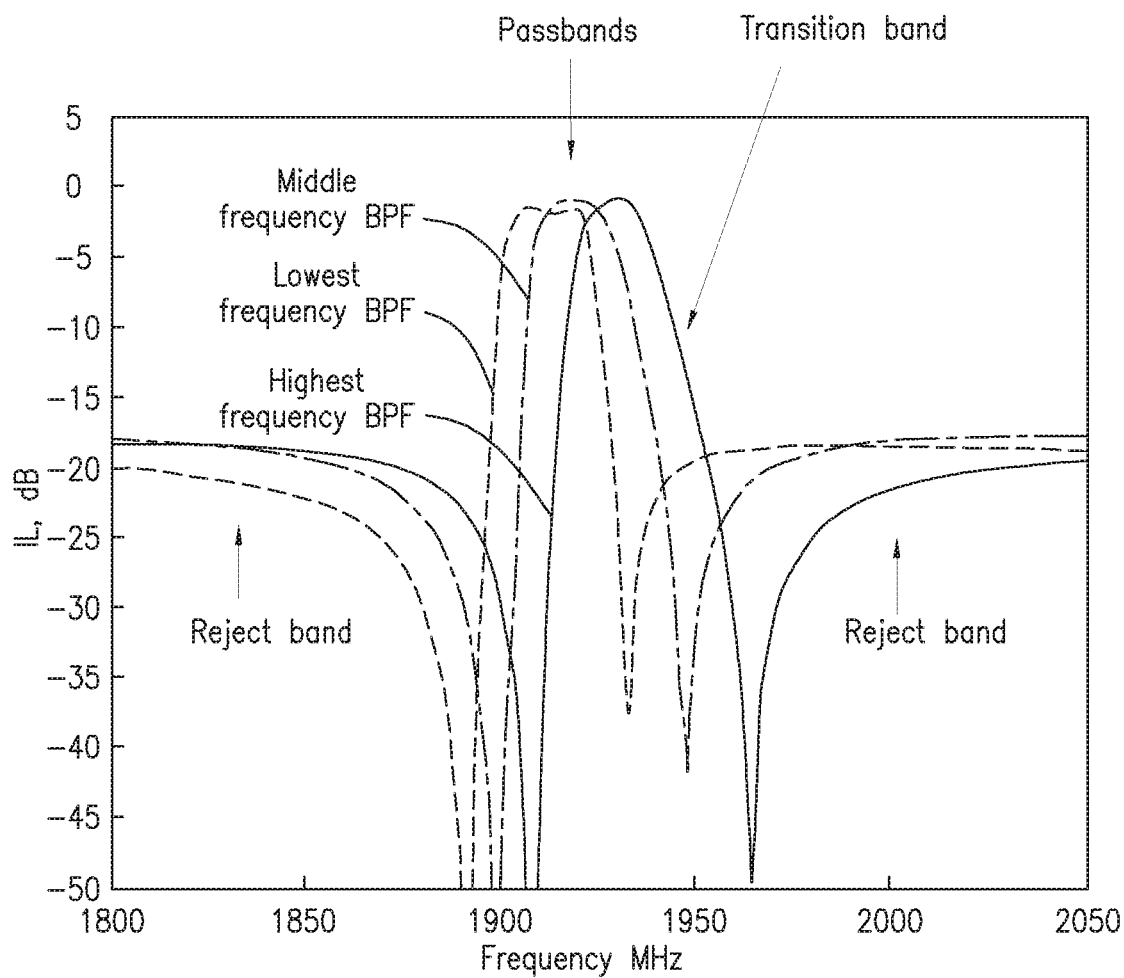
FIG. 4 is a graph of three band pass responses for the tunable band pass filter configuration of FIG. 3.

Before describing in detail exemplary embodiments, it is noted that the embodiments reside primarily in combinations of apparatus components and processing steps related to miniature tunable band pass and band reject filters for wireless transceivers. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In some embodiments, a tunable filter design includes a plurality of tunable resonator units having a plurality of acoustic resonators, and having switches to select a set of acoustic wave resonators associated with a particular frequency response having a corresponding bandwidth. By switching from one set of acoustic wave resonators to another set, the frequency tuning range of the tunable filter design is large compared to the frequency tuning range of a filter having only a single resonator in each tunable resonator unit. The embodiments described herein may be implemented with conventional SAW resonator, BAW resonator, FBAR resonator manufacturing technologies. These resonators are used in a tunable resonator unit to allow frequency overlap of their band reject or band pass regions to increase the maximum frequency tuning range of a filter, as compared with known solutions.

Figure 5:
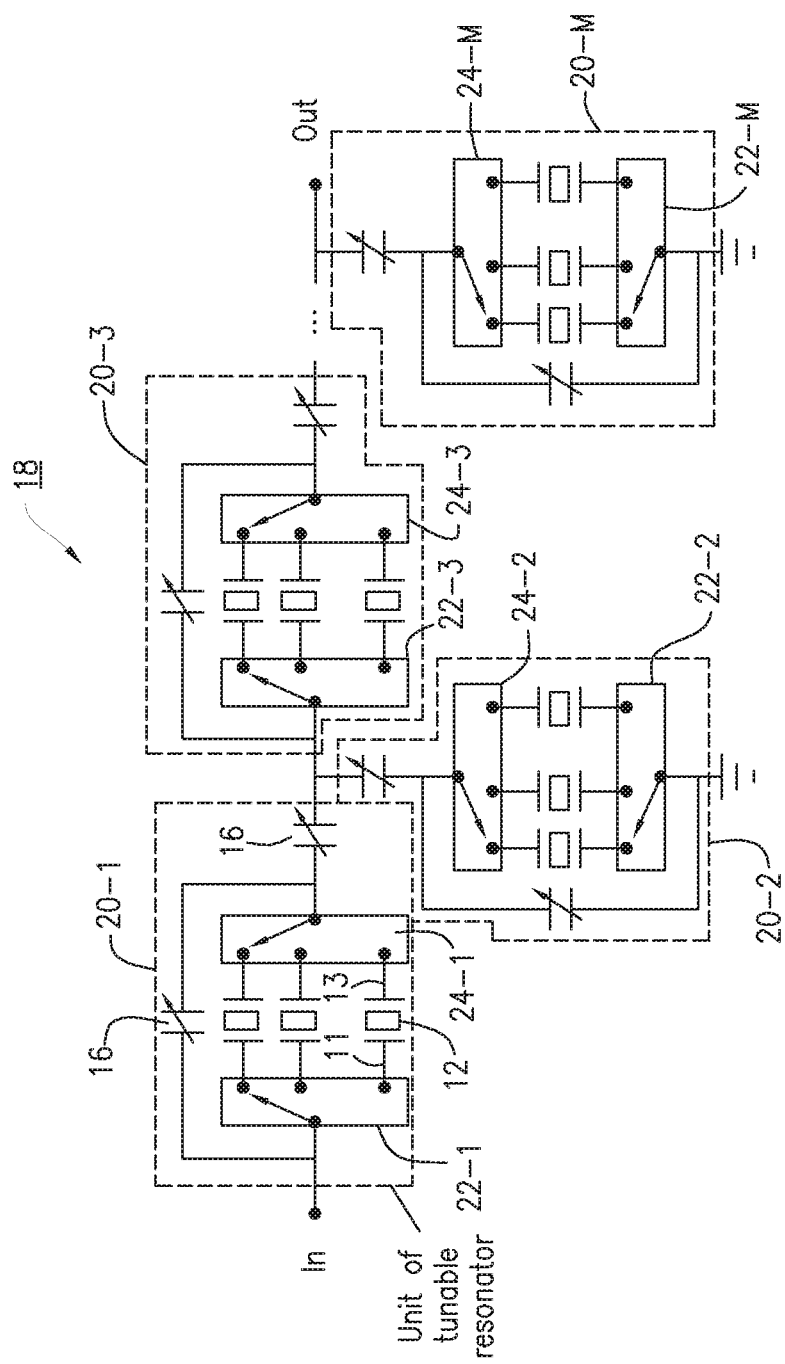
FIG. 5 is a tunable band pass filter having M tunable resonator units, each tunable resonator unit having N acoustic resonators.

FIG. 5 is a circuit diagram of one embodiment of a tunable band pass filter 18 constructed in accordance with principles discussed herein. Tunable band pass filter 18 includes a plurality (M) of tunable resonator units 20, where the mth tunable resonator unit of the M tunable resonator units may be denoted as 20-*m*. The M tunable resonator units in FIG. 5 are labeled 20-1, 20-2, 20-3 . . . 20-M. Each of the M tunable resonator units 20 has a plurality (N) of acoustic resonators 12, where N is greater than 1. Each tunable resonator unit also has tunable capacitors 16. Each of the N acoustic wave resonators 12-R1*m*, 12-R2*m*, 12-R3*m* . . . 12-Rn*m* . . . 12-RN*m* within a tunable resonator unit 20-*m* is associated with a different one of N different tunable frequency responses which may be selected one at a time. The acoustic wave resonators are referred to collectively as acoustic wave resonators 12. Thus, for example the first tunable resonator unit 20-1 has acoustic wave resonators 12-R11, 12-R21, 12-R31, 12-Rn1, . . . 12-RN1. All acoustic wave resonators 12-Rn*m* of each tunable resonator unit may be well known acoustic resonator components having a conventional electromechanical coupling coefficient of about 6%, which limits the tuning range of the tunable acoustic resonator unit with the nth resonator selected.

Each of the N acoustic wave resonators 12-R1*m*, 12-R2*m*, 12-R3*m* . . . 12-RN*m* of a tunable resonator unit m, such as 12-R11, 12-R21 . . . 12-Rn1 of the first tunable resonator unit, may be selected at its input 11 and output 13 by cooperative single pole, N-throw switches 22-*m* and 24-*m*. Thus, switches 22-1 and 24-1 of tunable resonator unit 1 may be positioned to select acoustic wave resonator 12-R11 or 12-R21 or 12-R31 or . . . 12-Rn1 . . . or 12-RN1. Switches 22-*m* and 24-*m* of tunable resonator unit m may be positioned to select resonator 12-R1*m* or 12-R2*m* or 12-R3*m* or . . . 12-Rn*m* . . . or 12-RN*m*. Switches 22-M and 24-M of tunable resonator unit M may be positioned to select resonator 12-R1M or 12-R2M or 12-R3M or 12-RnM or 12-RNM.

Further, in one embodiment, the switches of one tunable resonator unit are coupled to the switches of the other tunable resonator units so that each tunable resonator unit selects an nth acoustic resonator associated with the same tunable frequency response as the selected acoustic resonator of other tunable resonator units. Thus, for example, when switches 22-1 and 24-1 select acoustic wave resonator 12-Rn1, switches 22-2 and 24-2 select acoustic wave resonator 12-Rn2, . . . and switches 22-M and 24-M select acoustic wave resonator 12-RnM. Therefore, each tunable resonator unit 20-*m* selects an nth resonator associated with an nth tunable frequency response to produce the nth tunable frequency response. The selection of the nth acoustic resonator in each of the M tunable resonator units creates an nth sub-tunable filter. Stated another way, an nth sub-tunable filter is the filter that results from choosing the nth acoustic resonator in each one of the M tunable resonator units. An nth sub-tunable filter has a tuning range that overlaps the tuning range of an (n+1)th sub-tunable filter so that a continuous very broad tuning range of the tunable band pass filter is achieved.

Figure 6:
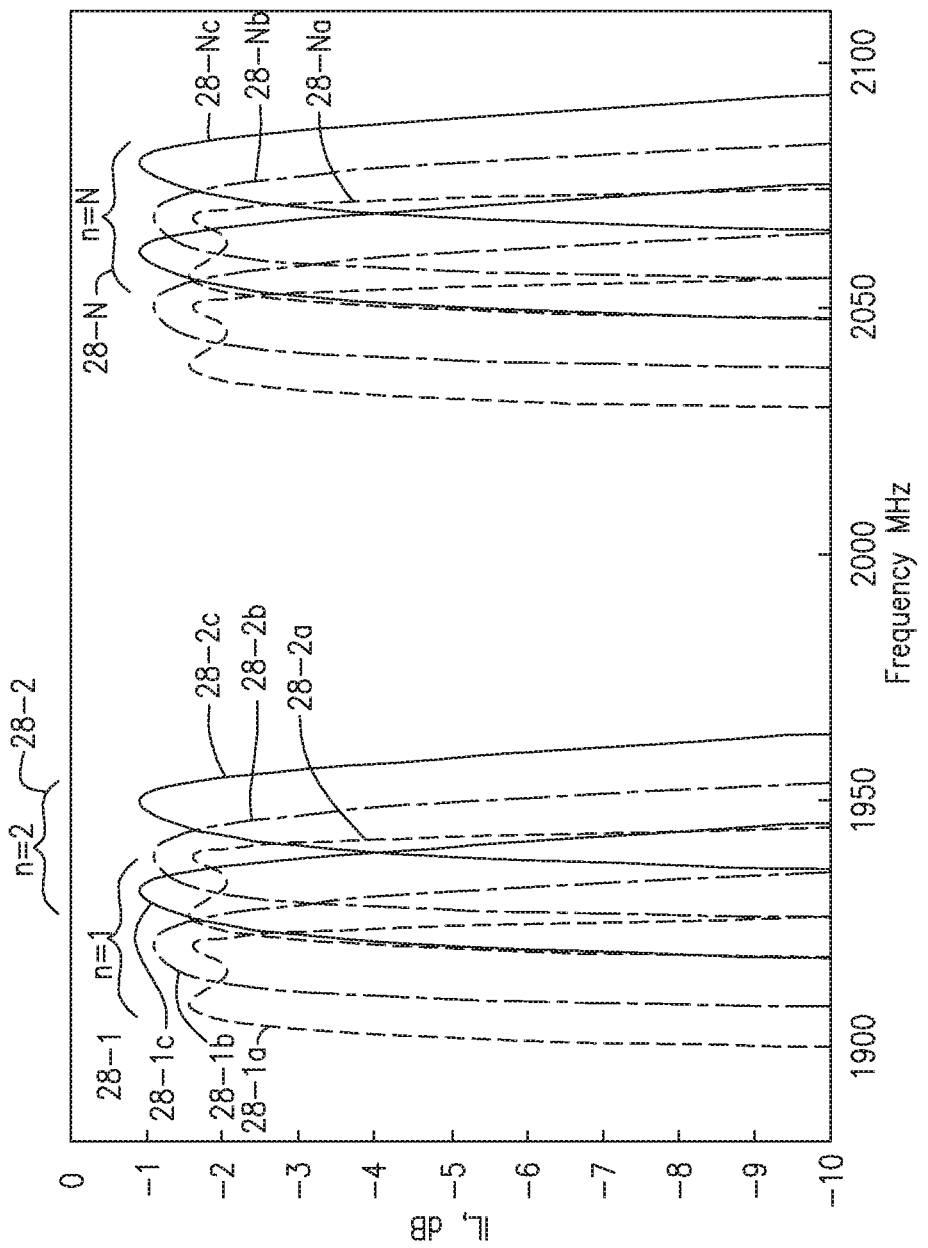
FIG. 6 is a graph of a band pass frequency response of the tunable band pass filter of FIG. 5.

FIG. 6 is a graph of the frequency response of the tunable band pass filter of FIG. 5. The nth resonator of each tunable resonator unit 20-1 to 20-M are associated with an nth sub-tunable filter having, in this example, a passband band of about 14 MHz. Each nth sub-tunable filter partially overlaps the adjacent (n−1)th and (n+1)th sub-tunable filter with their frequency tuning ranges. In the example of FIG. 6, the N sub-tunable filters may be selected one at a time to provide a tuning range between 1905 MHz to 2085 MHz. In the embodiment of FIG. 5, the tuning range of the passband of each set of the N sub-tunable filters may be designed to overlap in one time bandwidth of the passband so that there are no frequency gaps between their tuning ranges. Namely, the highest band of one sub-tunable filter overlaps a lowest band of an adjacent sub-tunable filter. It is understood that the frequency ranges and bandwidths shown in FIG. 6 are only illustrative examples. Implementations are not limited to the frequency ranges, overlaps or bandwidths shown.

In FIG. 6, the leftmost graphs 28-1 are a low (28-1*a*), medium (28-1*b*) and high (28-1*c*) frequency response of a first sub-tunable filter that includes acoustic wave resonators, 12-R11, 12-R12, 12-R13 . . . 12-R1M. The graphs 28-2 are the low (28-2*a*), medium (28-2*b*) and high (28-2*c*) frequency response of the second sub-tunable filter having the resonators, 12-R21, 12-R22, 12-R23 . . . 12-R2M. The 28-1*c* is overlapped with the 28-2*a* in passband. The rightmost graphs 28-N are the low, medium and high frequency responses of the Nth sub-tunable filter which consists of acoustic wave resonators, 12-RN1, 12-RN2, 12-RN3, . . . 12-RNM. In FIG. 6, when the first sub-tunable filter (28-1) is selected by the switches 22 and 24, the tunable frequency response 28-1*a*, 28-1*b* and 28-1*c* are realized, for example, by tuning the tunable capacitors 16 in each of the tunable resonator units 20 in FIG. 5. When the tunable passband is above one of curve 28-1*c*, the second sub-tunable filter is selected using the switches 22 and 24, and the tunable frequency responses 28-2*a*, 28-2*b* and 28-2*c* are realized by tuning the tunable capacitors 16 in each tunable resonator unit 20 in FIG. 5. When the last sub-tunable filter (28-N) is selected using the switches 22 and 24, the tunable frequency response 28-Na, 28-Nb and 28-Nc are also realized by tuning the tunable capacitors 16 in each tunable resonator unit 20 in FIG. 5. Thus, although the frequency tuning range of one set of the tunable resonators forming a sub-tunable filter is relatively narrow, for example the tuning range from the 28-1*a* to 28-1*c* for the first sub-tunable filter 28-1, the overall frequency tuning range of the tunable filter 18 is much greater because of the N different resonators in each tunable resonator unit 20 and their corresponding roles for forming the sub-tunable filters that collectively extend the overall tuning frequency range of the tunable filter 18. In some embodiments, the overall passband tuning range of the tunable band pass filter 18 is about N times the passband tuning range of the sub-tunable filters.

Figure 7:
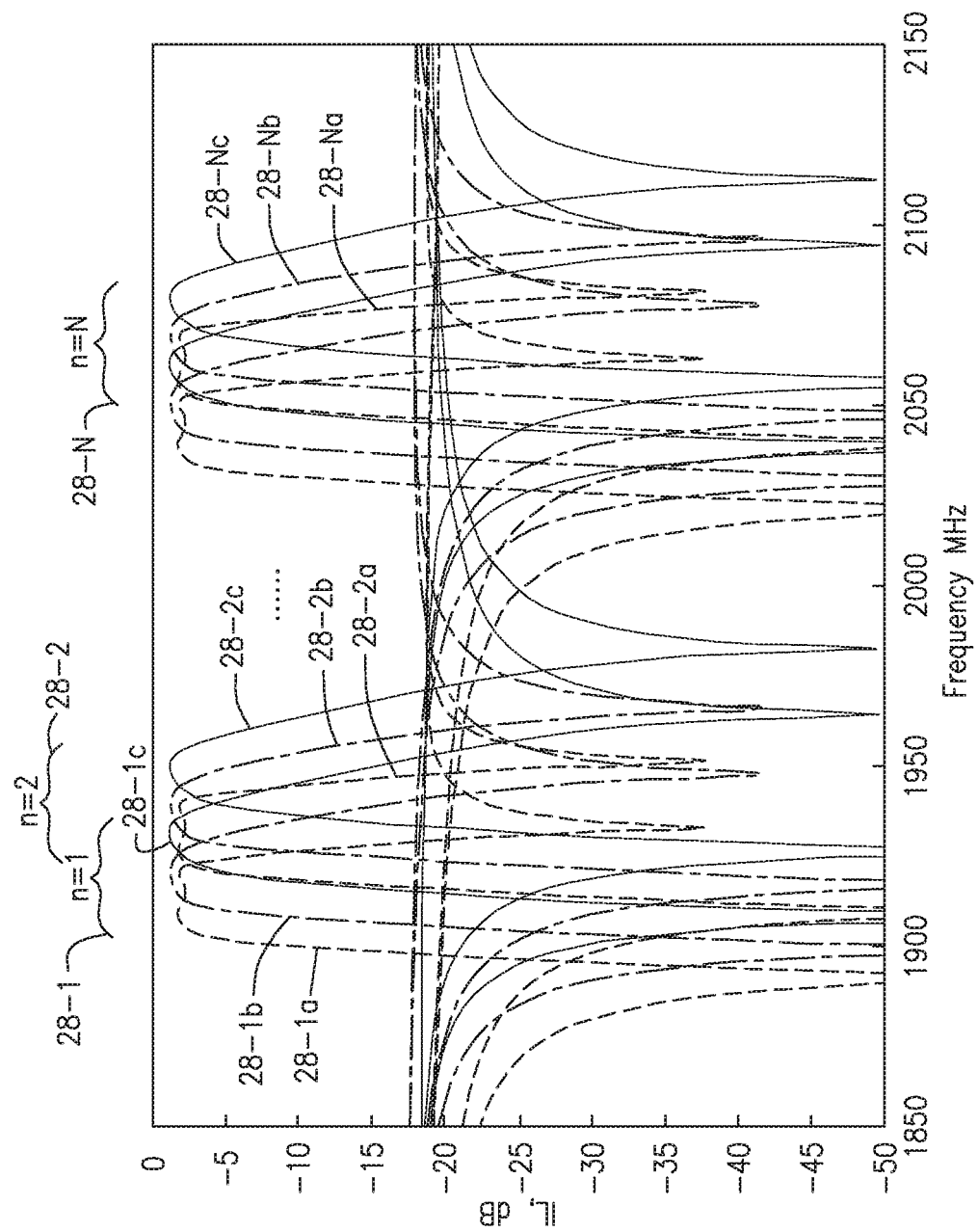
FIG. 7 is a graph of the band pass frequency response of the tunable band pass filter of FIG. 5, with a vertical scale extending from 0 to −50 dB.

FIG. 7 is the plot of the same frequency response of FIG. 6, except that the vertical scale extends from 0 to −50 dB and the example frequency scale is from 1850 MHz to 2150 MHz. In FIG. 7, the different frequency responses are shown by different line traces. For example, the curves 28-1a, 28-1b and 28-1c are low, medium and high frequency bands, respectively, for a first sub-tunable filter. The curves 28-2a, 28-2b and 28-2c are low, medium and high frequency bands, respectively, for a second sub-tunable filter. The curves 28-Na, 28-Nb and 28-Nc are low, medium and high frequency bands, respectively, for the Nth sub-tunable filter.

In some embodiments, the sub-tunable filters may have a passband of greater than 14 MHz. This will be the case as design of acoustic resonators improves in the future. Here again, it is understood that the frequency tuning ranges and bandwidths of the sub-tunable filters shown in FIG. 7 are only illustrative examples. Implementations are not limited to the frequency ranges, overlaps or bandwidths shown.

Note that the configuration, i.e., electrical interconnection arrangement, of tunable resonator units in FIG. 5 is but one example. Other configurations may be implemented. For example, two series connected tunable resonator units may be followed by one or more parallel tunable resonator units, followed by one or more series tunable resonator units followed by one or more parallel tunable resonator units, etc. In the particular configuration of FIG. 5, two tunable resonator units are in an electrical series arrangement while two other tunable resonator units are in an electrical parallel arrangement.

Figure 8:
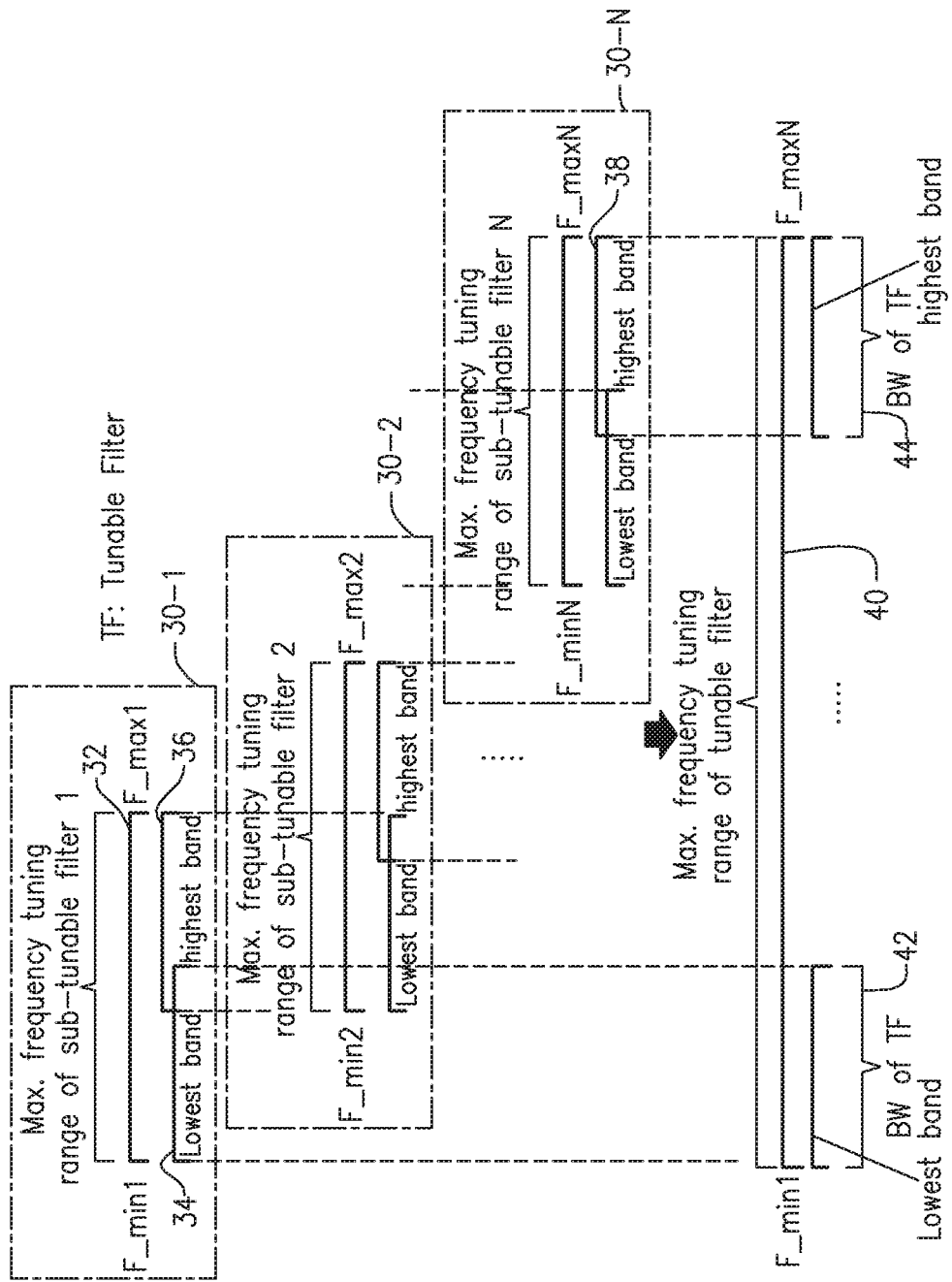
FIG. 8 is a graph of example overlapping frequency responses of N sub-tunable filters.

Referring to FIG. 8, box 30-1 shows a maximum tuning range of a tunable filter 18 when a first one of the N resonators of each of the M tunable resonator units is selected (sub-tunable filter 1). Box 30-2 shows the maximum frequency tuning range of the tunable filter when a second one of the N resonators of each of the M tunable resonator units is selected (sub-tunable filter 2). Box 30-N shows the maximum tuning range of the tunable filter when the Nth resonators of each of the M tunable resonator units is selected (sub-tunable filter N).

A first frequency tuning range 32 of the sub-tunable filter 1 may be continuously tuned from a lowest tunable band 34 to a highest tunable band 36 of the first. A similar frequency tuning range is provided by each of sub-tunable filter 2 to sub-tunable filter N, which has the highest tunable band 38. Since the frequency tuning range of each sub-tunable filter partially overlaps with the frequency tuning range of an adjacent sub-tunable filter, the overall total continuous frequency tuning range 40 is much wider than the frequency tuning range of any individual sub-tunable filter. As is shown in the example of FIG. 8, the lowest band is band 42 and the highest band is band 44. The overlap of the high tunable band of an nth sub-tunable filter with a low tunable band of the (n+1)th sub-tunable filter is at least as great as an operational bandwidth of a wireless transceiver in some embodiments. In FIG. 8, the operational bandwidth of the tunable filter is shown in letters BW of TF.

Figure 9:
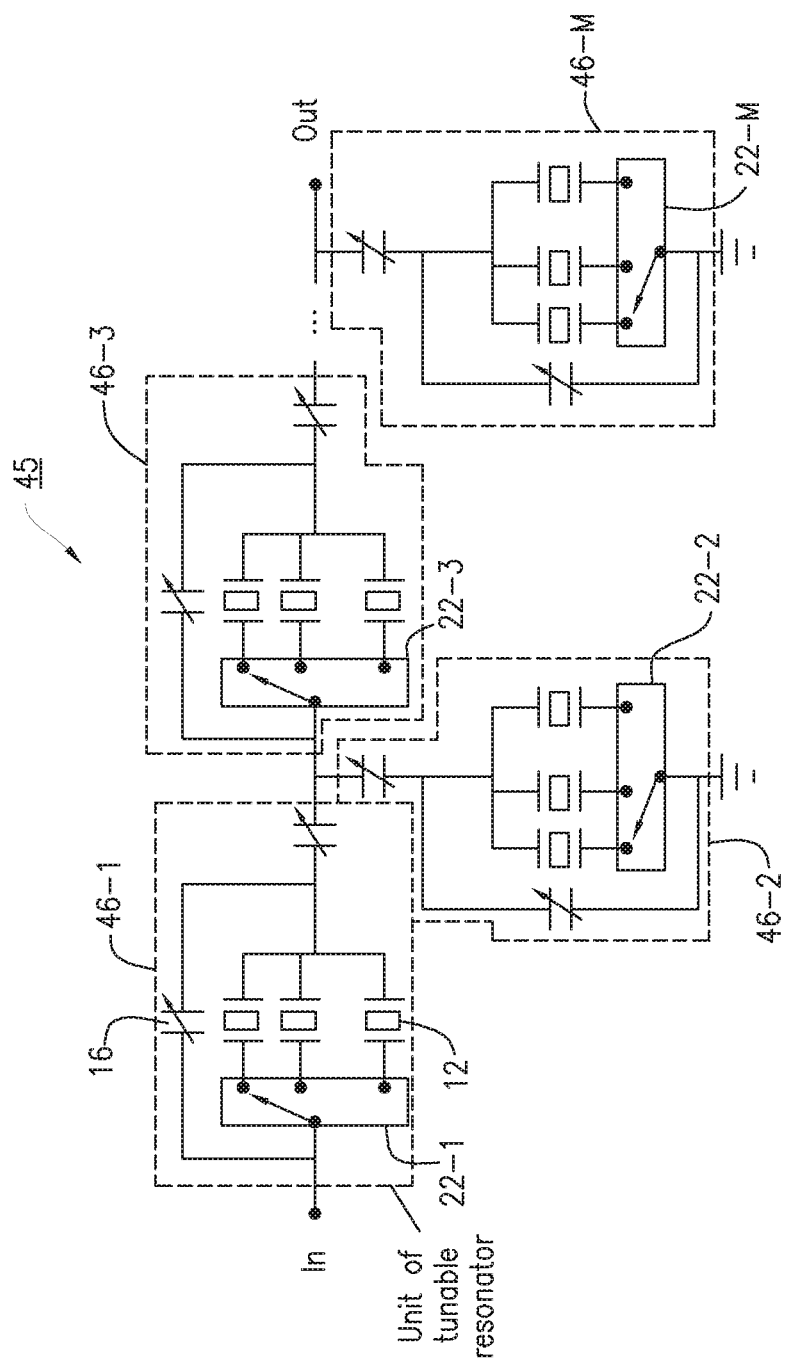
FIG. 9, is a tunable band pass filter having M tunable resonator units, each tunable resonator having only one single pole N throw switch.

FIG. 9 is a circuit diagram of another type of tunable band pass filter 45 which is similar to the bandpass filter configuration of FIG. 5 except that each tunable resonator unit 46-m has only one switch 22-m to select an nth resonator of the mth tunable resonator unit 46-m. Thus, for example, when the switch 22-1 selects an nth resonator of the first tunable resonator unit 46-1, the switch 22-2 selects the corresponding nth resonator of the second tunable resonator unit 46-2, . . . and the switch 22-M selects the corresponding nth resonator of the Mth tunable resonator unit 46-M.

An advantage of the tunable band pass filter configuration of FIG. 9 over the tunable band pass configuration of FIG. 5 is the smaller size, weight and cost that is obtained by using only one half of the number of switches in the tunable resonator units. However, the band pass configuration of FIG. 9 may result in lower or less stable filter performance as compared with the arrangement of FIG. 5 because each non-selected acoustic resonator will still have one port connected to the selected acoustic resonator. In other words, the non-selected acoustic resonators will not be electrically isolated from the circuit.

Note also that in some embodiments, the number of acoustic resonators in each tunable resonator unit can be different. For example, one tunable resonator unit may have 3 acoustic resonators while another tunable resonator unit may have 2 acoustic resonators, providing a total of 3 different frequency sub-tunable filters. More generally, one tunable resonator unit may have N1 acoustic resonators while another tunable resonator unit may have N2 acoustic resonators, providing a total of N3 different sub-tunable filters, where N1 and N2 are integers, and N3 is the larger of N1 and N2. In such configurations, where the number of acoustic resonators in each tunable resonator unit is different, some of the acoustic resonators may be used more than once to form different sub-tunable filters.

Figure 10:
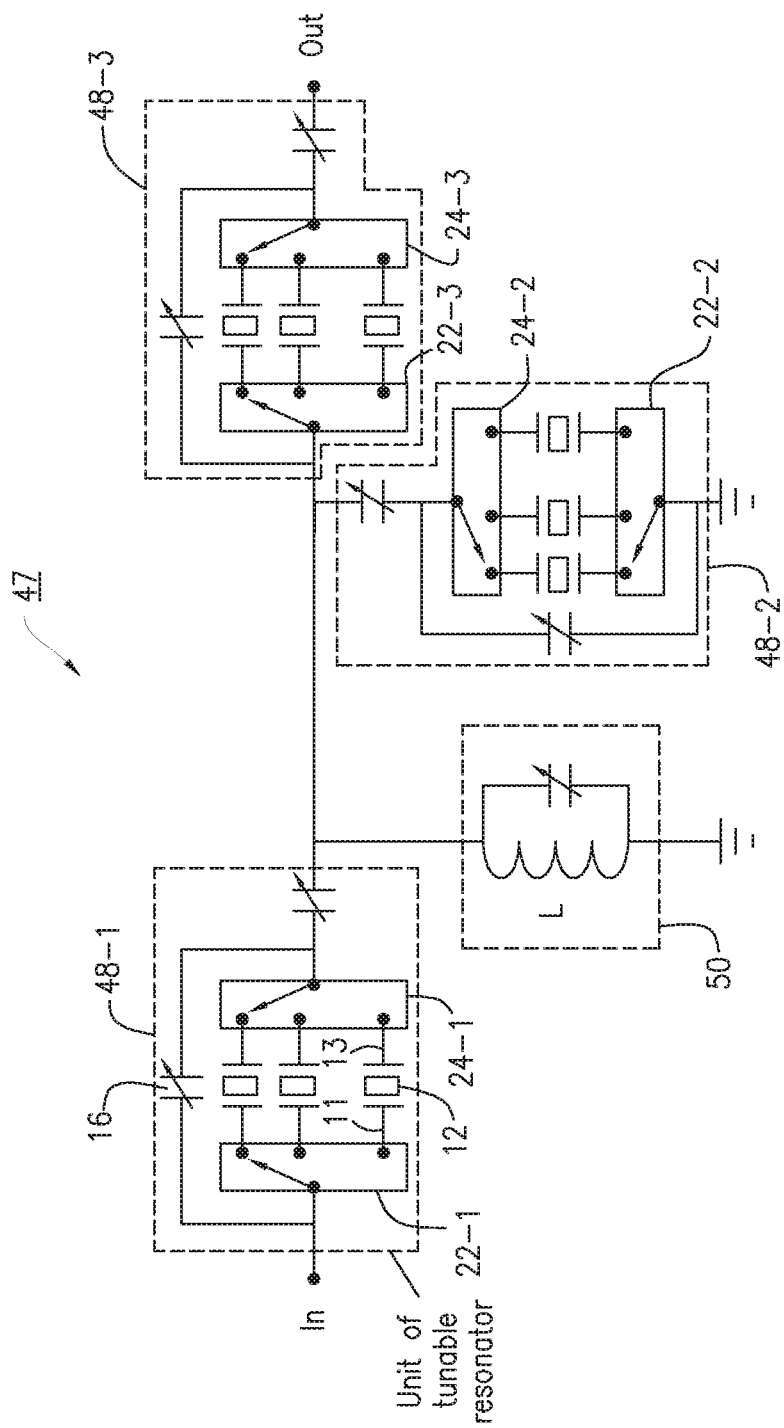
FIG. 10 is a tunable T-type band reject filter constructed in accordance with principles discussed herein.

FIG. 10 shows a tunable T-type band reject filter 47 that includes three tunable resonator units 48-1, 48-2 and 48-3 in a T configuration. Each tunable resonator unit has two switches 22 and 24 to select an nth acoustic resonator of the tunable resonator unit. Thus, the switches 22-1, 22-2 and 22-3 cooperate to select the input of the nth acoustic resonator of their respective tunable resonator units, and the switches 24-1, 24-2 and 24-3 cooperate to select the output of the nth acoustic resonator of their respective tunable resonator units. Thus, the switch 22-1 cooperates with the switch 24-1 to select an nth acoustic resonator of the tunable resonator unit 48-1, the switch 22-2 cooperates with the switch 24-2 to select the nth acoustic resonator of tunable resonator 48-2, and the switch 22-3 cooperates with the switch 24-3 to select the nth acoustic resonator of tunable resonator 48-3.

Note that in the case of the T-type band reject filter, the number of acoustic resonators in each tunable resonator unit may be one or greater than one. When only one resonator is in each tunable resonator unit, no switch is required. Note that although the frequency tuning range of one set of acoustic resonators, namely, a sub-tunable filter, is relatively narrow, when a plurality of acoustic resonators are provided in each tunable resonator unit, the overall frequency tuning range of the tunable filter shown in FIG. 10 is much greater because the N different acoustic resonators in each tunable resonator unit may be selected one at a time to provide N different sub-tunable filters that collectively form a wider tuning range of the tunable filter.

In an alternative embodiment, switches 24-1, 24-2 and 24-3 could be omitted, as in the case of the embodiment of FIG. 9. Or, in an alternative embodiment, switches 22-1, 22-2 and 22-3 could be omitted instead of the switches 24-1, 24-2 and 24-3. Thus, the tunable resonator units 36 of FIG. 10 could be replaced by one or more single switch tunable resonator units that are similar to the tunable resonator units 46 in FIG. 9.

Note that the tunable T-type band reject filter 47 has the same type of tunable resonator unit as shown in FIG. 5, but has in addition, a tunable matching block 50 which is associated with the selected acoustic wave resonators 12-Rn1, 12-Rn2 and 12-Rn3. An advantage to the tunable matching block 50 is the ability to provide an inductive tunable component by using only a single tunable capacitor along with a fixed inductor.

Figure 11:
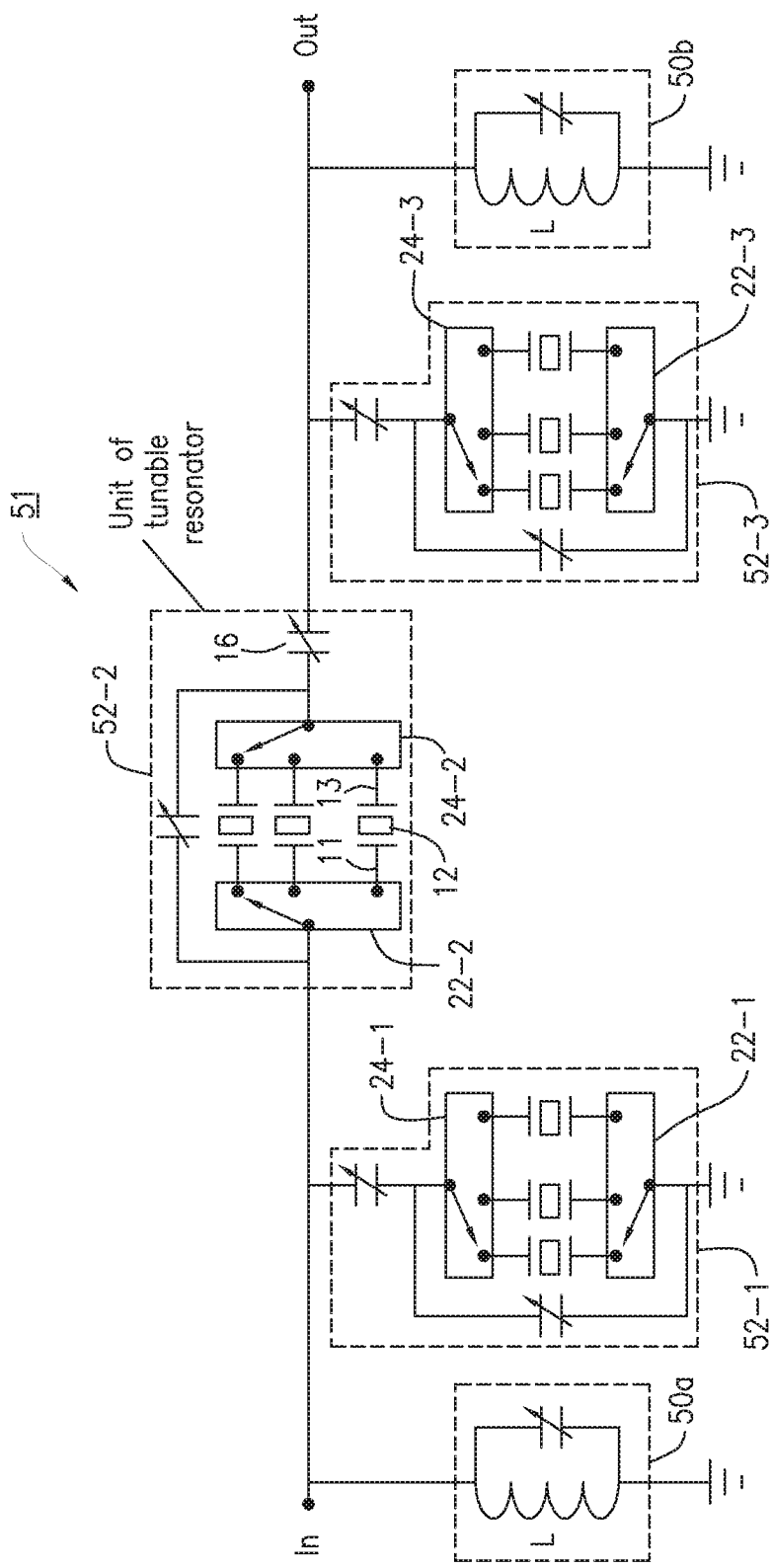
FIG. 11 is a tunable pi-type band reject filter constructed in accordance with principles discussed herein.

FIG. 11 is a tunable pi-type band reject filter 51 that includes three tunable resonator units 52-1, 52-2 and 52-3 in a pi configuration. The tunable resonator units 52 are the same as used in the tunable band pass filter configuration of FIG. 5. However, the introduction of the tunable matching blocks 50a and 50b in parallel with the tunable resonator units 52-1 and 52-3, respectively, produces a tunable band reject filter response for each triplet of acoustic wave resonators 12-Rn1, 12-Rn2 and 12-Rn3 selected by the switch pairs (22-1, 24-1), (22-2, 24-2) and (22-3, 24-3). An advantage to the tunable matching blocks 50a and 50b is the ability to provide an inductive tunable component using only a single tunable capacitor along with a fixed inductor for each side of the pi-type tunable band reject filter of FIG. 11.

Thus, the switches 22 and 24 cooperate in each of the three tunable acoustic resonator units of the tunable pi-type band reject filter to select the nth acoustic resonator.

Note that in the case of the pi-type band reject filter, the number of resonators in each tunable resonator unit may be one or greater than one. When only one resonator is in each tunable resonator unit, no switch is required. Note that in some embodiments, only half the switches may be employed so that, for example, switches 24-1, 24-2 and 24-3 may be omitted, or instead, switches 22-1, 22-2 and 22-3 may be omitted. Thus, the resonator units 52 of FIG. 11 could be replaced by one or more single switch tunable resonator units 46 from FIG. 9. Note that although the frequency tuning range of one set of resonators, namely a sub-tunable filter is relatively narrow, the overall frequency tuning range is much greater because of the N different resonators in each tunable resonator unit.

Note that a pi-type tunable band reject filter may be followed by another pi-type tunable band reject filter or may be followed by a T-type tunable band reject filter. Similarly, a T-type tunable band reject filter may be followed by another T-type band reject filter or may be followed by a pi-type band reject filter. In other words, the tunable resonator units 20 in FIG. 5 or 46 in FIG. 9 may be assembled to form pi-type or T-type tunable band reject filters, and the pi-type and T-type tunable band reject filters may be assembled into larger filter arrangements. Note also that for the band reject filters, a band pass region of the band reject filter may be chosen to be above or below the band of reject band, depending on the application.

Figure 12:
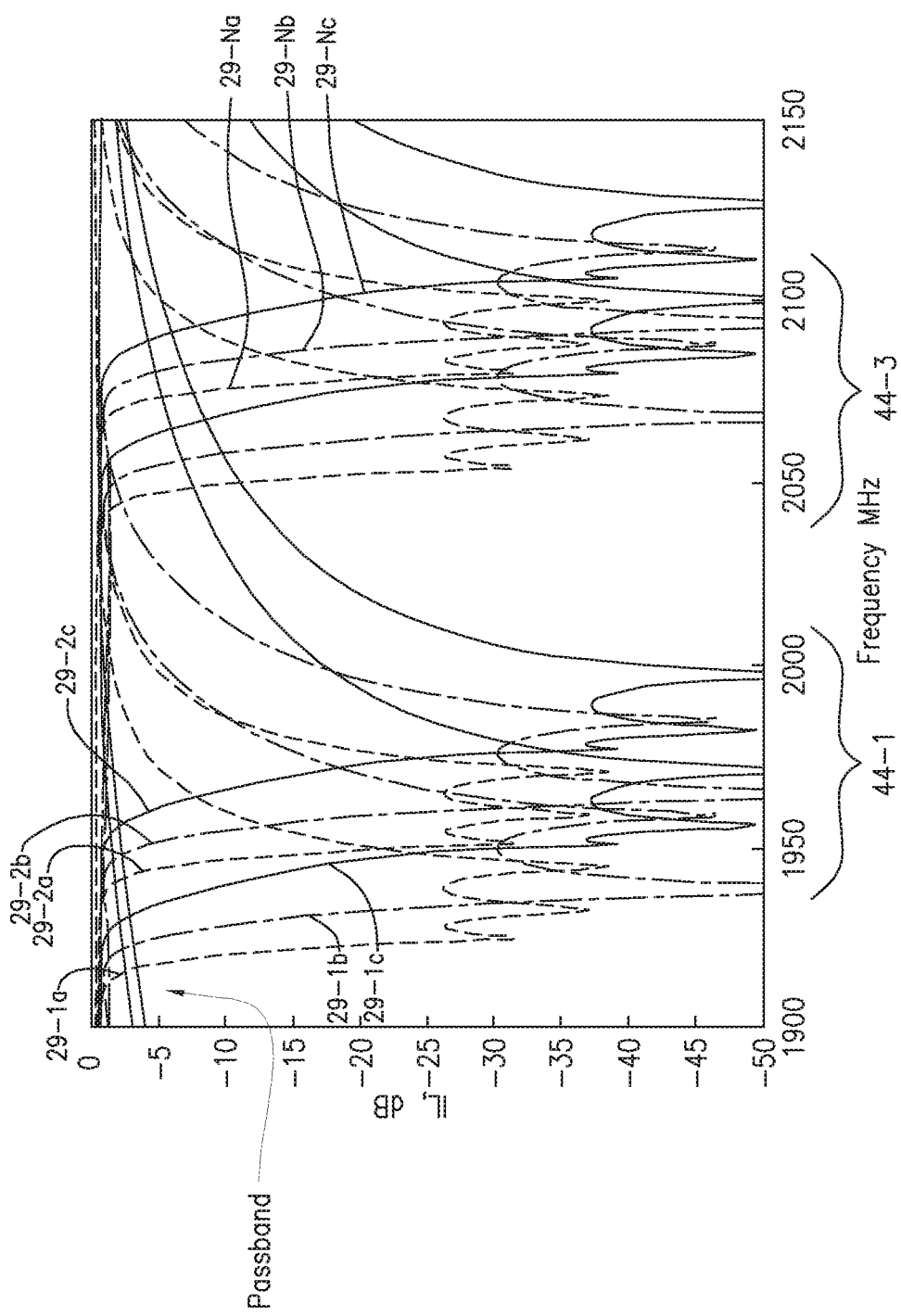
FIG. 12 is a graph of the band reject frequency response of a tunable band reject filter with the passband below the band reject frequency region.

For example, FIG. 12 is a graph of a response of N sub-tunable filters of the T-type band reject filter, where the pass band is at low side of the reject band of the frequency response. The three curves 29-1a, 29-1b and 29-1c are low, medium and high responses for the first sub-tunable filter, the three curves 29-2a, 29-2b and 29-2c are low, medium and high responses for the second sub-tunable filter and the three curves 29-Na, 29-Nb and 29-Nc are low, medium and high responses for the Nth sub-tunable filter. In FIG. 12, the overall frequency tuning range of the T-type band reject filter is from 1923.35 MHz to 2129.68 MHz. It is understood that the frequency ranges and bandwidths shown in FIG. 12 are only illustrative examples. Implementations are not limited to the frequency ranges, overlaps or bandwidths shown.

Figure 13:
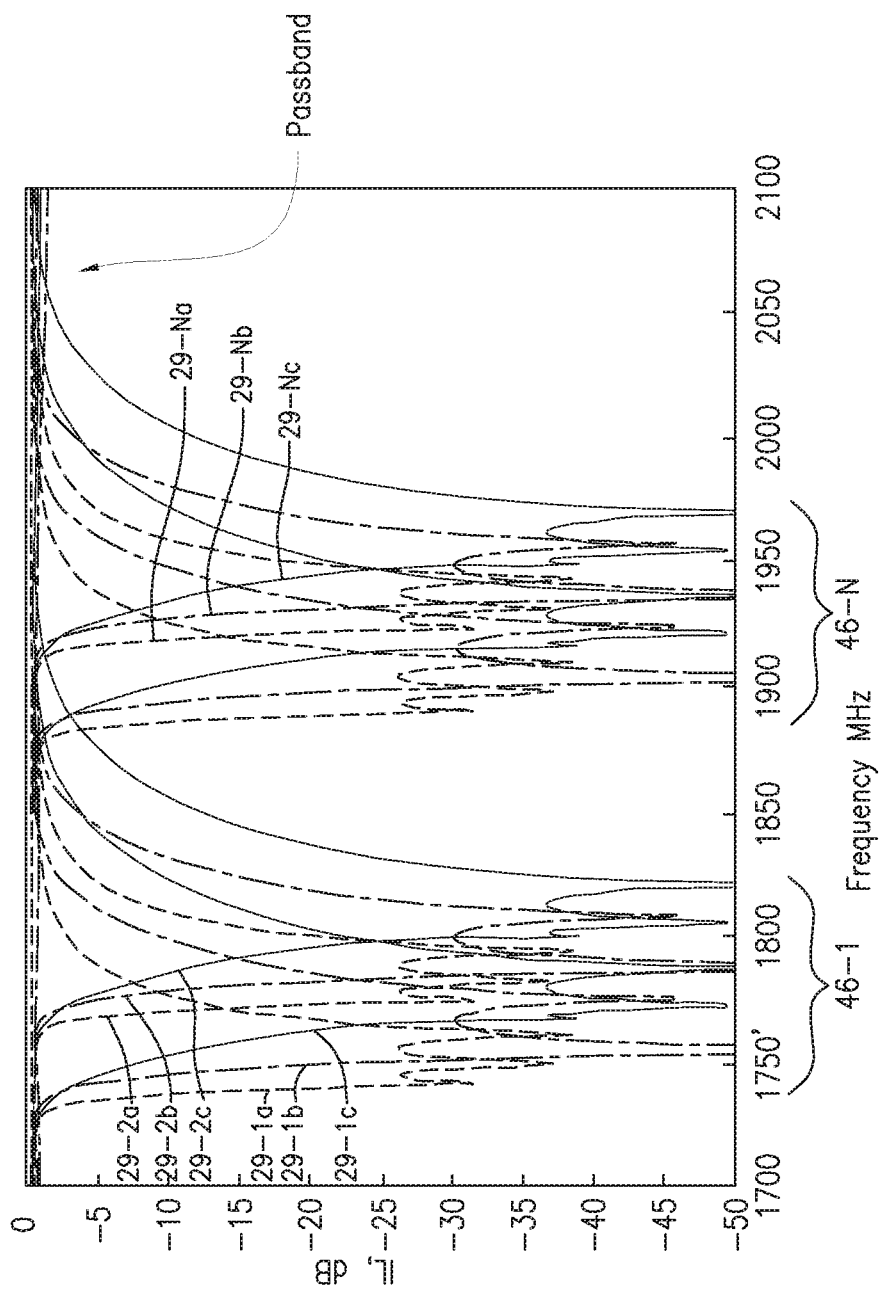
FIG. 13 is a graph of the band reject frequency response of a tunable band reject filter with the passband above the band reject frequency region.

FIG. 13 is a graph of a response of N sub-tunable filters of the T-type band reject filter, where the pass band is at high side of the reject band of the frequency response. The three curves 29-1a, 29-1b and 29-1c are the low, medium and high responses for the first sub-tunable filter, the three curves 29-2a, 29-1b and 29-2c are the low, medium and high responses for the second sub-tunable filter and the three 29-Na, 29-Nb and 29-Nc are the low, medium and high responses for the Nth sub-tunable filter. In FIG. 13, the overall frequency tuning range of the T-type band reject filter is from 1740.15 MHZ to 1980.5 MHz. It is understood that the frequency ranges and bandwidths shown in FIG. 13 are only illustrative examples. Implementations are not limited to the frequency ranges, overlaps or bandwidths shown.

Figures 14, 15:
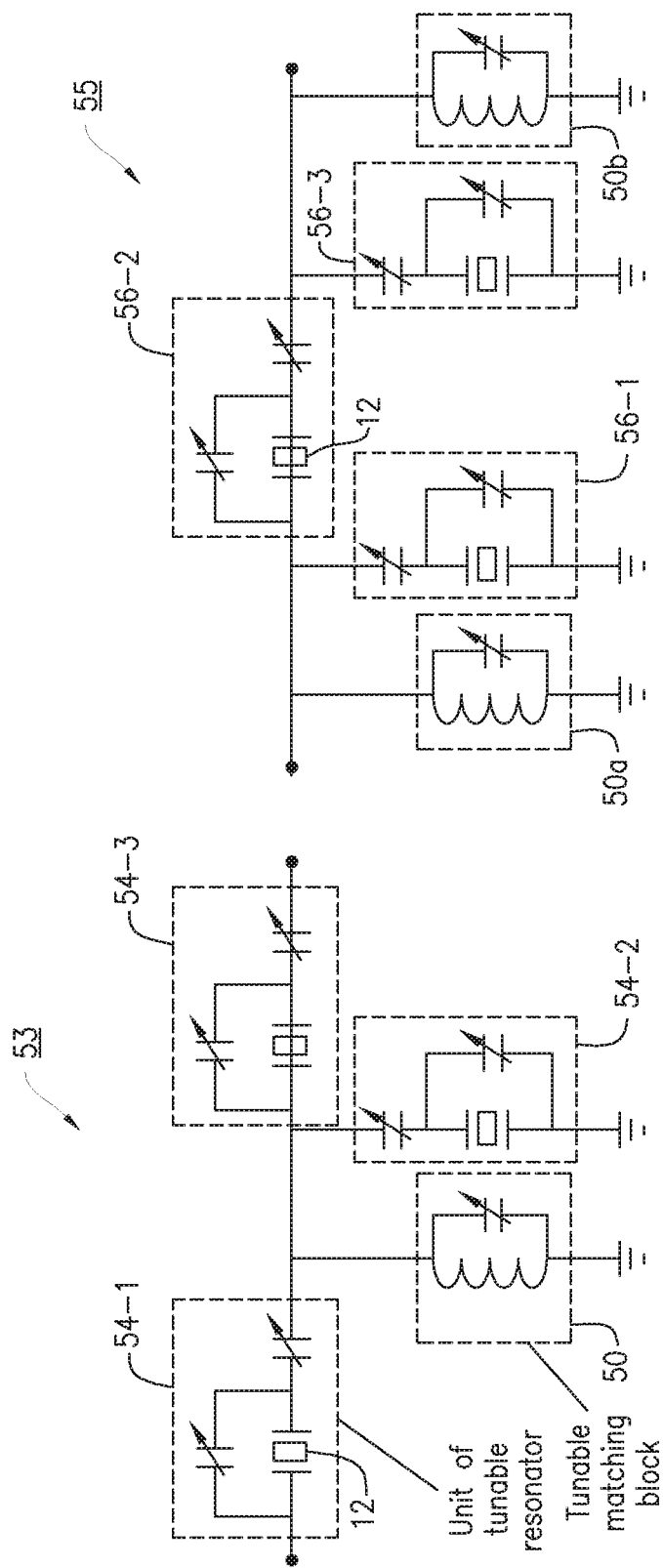
FIG. 14 is a tunable T-type band reject filter.
FIG. 15 is a tunable pi-type band reject filter.

In both FIGS. 12 and 13, the reject band frequency response of each of the N sub-tunable filters may be designed to overlap so that there are no gaps between them. In particular the bandwidth of the overlap may be at least as great as an operational bandwidth of the reject band of the device using the filter. Another embodiment is described with reference to FIG. 14. FIG. 14 is a T-type band reject filter 53 having only one acoustic resonator 12 for each tunable resonator unit 54-1, 54-2 and 54-3, and having a tunable matching block 50 electrically in parallel with the tunable resonator unit 54-2. The embodiment shown in FIG. 15 is a pi-type band reject filter 55. Pi-type band reject filter 55 has only one acoustic resonator 12 for each tunable resonator unit 56-1, 56-2 and 56-3, and having a first tunable matching block 50a electrically in parallel with the tunable resonator unit 56-1 and having a second tunable matching block 50b electrically in parallel with the tunable resonator unit 56-3.

Embodiments described herein provide a commercially implementable low cost, low weight, small size acoustic resonator based tunable filter for band pass applications and band reject applications. The small size and broad frequency tuning range of such filters makes them suitable for wireless communication applications including use in small cell base stations and wireless hand held devices, such as cell phones. Note that research to achieve higher electromechanical coupling coefficients for small SAW, BAW and FBAR resonators is ongoing in order to achieve improved tuning range of these types of resonators. Embodiments described herein may employ existing acoustic resonators and improved acoustic resonators to be developed in the future to increase bandwidth even further. Moreover, embodiments described above offer an ability to tune the frequency response of a set of resonators and to select each tunable frequency response, one at a time.

Many different embodiments have been disclosed herein, in connection with the above description and the drawings. It will be understood that it would be unduly repetitious and obfuscating to literally describe and illustrate every combination and sub-combination of these embodiments. Accordingly, all embodiments can be combined in any way and/or combination, and the present specification, including the drawings, shall be construed to constitute a complete written description of all combinations and sub-combinations of the embodiments described herein, and of the manner and process of making and using them, and shall support claims to any such combination or sub-combination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A tunable filter, the tunable filter comprising:
M tunable resonator units, M being an integer greater than 1 and each tunable resonator unit having:

N acoustic wave resonators, N being an integer greater than 1 and each acoustic wave resonator of the N acoustic wave resonators being associated with a different tunable frequency response, each different tunable frequency response i) having a corresponding bandwidth and ii) having an individual tuning range being tunable between an individual lowest band and an individual highest band;

a tunable capacitor configured to tune each of the N acoustic wave resonators in its individual tuning range; and a first switch configured to select one of the N acoustic wave resonators at a time, the respective first switches and tunable capacitors of the M tunable resonator units being coupled to cooperatively select one acoustic wave resonator in each one of the M tunable resonator units, such that, in each of the M tunable resonator units, a same individual band in the individual tuning range of a same selected one of the N acoustic wave resonators is tuned to, in order to achieve an overall tunable frequency response.

2. The tunable filter of claim 1, wherein at least two of the M tunable resonator units are:
electrically in series; or
are situated in parallel arms of the tunable filter having a ladder structure.

3. The tunable filter of claim 1, further comprising a tunable matching block electrically in parallel with at least one of the M tunable resonator units and wherein the tunable filter is a band reject filter; or
each of the N acoustic wave resonators has a corresponding input and output, the first switch being electrically coupled to one of the inputs and the outputs of the N acoustic wave resonators.

4. The tunable filter of claim 1, wherein each tunable resonator unit further comprises a second switch configured to cooperate with the first switch to select one of the N acoustic wave resonators at a time.

5. The tunable filter of claim 4, wherein each of the N acoustic wave resonators has a corresponding input and a corresponding output, the first switch being electrically coupled to one of the inputs and the outputs of the N acoustic wave resonators and the second switch being electrically coupled to the other of the inputs and the outputs of the N acoustic wave resonators.

6. The tunable filter of claim 1, wherein the tunable filter is a tunable band pass filter, and
the different tunable frequency response is a different tunable band pass frequency response; and
a same tunable frequency response is a same tunable band pass frequency response.

7. The tunable filter of claim 6, wherein each tunable resonator unit further comprises a second switch configured to cooperate with the first switch to select one of the N acoustic wave resonators at a time; or
each of the N acoustic wave resonators has a corresponding input and output, the first switch being electrically coupled to one of the inputs and the outputs of the N acoustic wave resonators; or
each of the N acoustic wave resonators has a corresponding input and a corresponding output, the first switch being electrically coupled to one of the inputs and the outputs of the N acoustic wave resonators and a second switch being electrically coupled to the other of the inputs and the outputs of the plurality of acoustic wave resonators.

8. The tunable filter of claim 6, wherein the number of different tunable band pass frequency responses is N.

9. The tunable filter of claim 8, wherein the individual tuning range of each of the N different tunable bandpass frequency responses partially overlap adjacent ones of the N tunable band pass frequency responses.

10. The tunable filter of claim 1, wherein:
the tunable filter is a tunable band reject filter, and
the different tunable frequency response is a different tunable band reject frequency response,
a same tunable frequency response is a same tunable band reject frequency response, and
the overall tunable frequency response is an overall tunable band reject frequency response.

11. The tunable filter of claim 10, wherein three tunable resonator units are in an electrical T configuration.

12. The tunable filter of claim 11, further comprising a tunable matching block in parallel with one of the three tunable resonator units.

13. The tunable filter of claim 10, wherein three tunable resonator units are in an electrical pi configuration.

14. The tunable filter of claim 13, further comprising two tunable matching blocks, each tunable matching block electrically in parallel with one of the three tunable resonator units.

15. The tunable filter of claim 10, wherein each tunable resonator unit further includes a second switch configured to cooperate with the first switch to select one of the N acoustic wave resonators at a time; or
the number of different tunable band reject filter responses is N; or
each of the N acoustic wave resonators has a corresponding input and output, the first switch being electrically coupled to one of the inputs and the outputs of the N acoustic wave resonators; or
each of the N acoustic wave resonators has a corresponding input and a corresponding output, the first switch being electrically coupled to one of the inputs and the outputs of the N acoustic wave resonators and a second switch being electrically coupled to the other of the inputs and the outputs of the N acoustic wave resonators.

* * * * *